United States Patent
Dirnecker

(10) Patent No.: US 9,865,582 B2
(45) Date of Patent: Jan. 9, 2018

(54) INTEGRATED THINFILM RESISTOR AND MIM CAPACITOR WITH A LOW SERIAL RESISTANCE

(71) Applicant: Texas Instruments Deutschland GMBH, Freising (DE)

(72) Inventor: Christoph Dirnecker, Eching (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/003,955

(22) Filed: Jan. 22, 2016

(65) Prior Publication Data

US 2016/0141283 A1 May 19, 2016

Related U.S. Application Data

(62) Division of application No. 14/501,277, filed on Sep. 30, 2014, now Pat. No. 9,281,355.

(60) Provisional application No. 61/988,357, filed on May 5, 2014.

(51) Int. Cl.
| | |
|---|---|
| H01L 27/01 | (2006.01) |
| H01L 49/02 | (2006.01) |
| H01L 21/70 | (2006.01) |
| H01L 23/522 | (2006.01) |
| H01L 21/311 | (2006.01) |
| H01L 21/3213 | (2006.01) |
| H01L 23/532 | (2006.01) |

(52) U.S. Cl.
CPC ...... *H01L 27/016* (2013.01); *H01L 21/31116* (2013.01); *H01L 21/32135* (2013.01); *H01L 21/707* (2013.01); *H01L 23/5223* (2013.01); *H01L 23/5226* (2013.01); *H01L 23/5228* (2013.01); *H01L 28/20* (2013.01); *H01L 28/60* (2013.01); *H01L 21/31144* (2013.01); *H01L 21/32139* (2013.01); *H01L 23/53266* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,365,480 B1 * | 4/2002 | Huppert | H01L 27/0682 257/E21.006 |
| 8,803,287 B2 | 8/2014 | Dirnecker et al. | |
| 2004/0239478 A1 | 12/2004 | Amadon et al. | |
| 2010/0295149 A1 * | 11/2010 | Summerfelt | H01L 23/5223 257/529 |
| 2011/0306207 A1 | 12/2011 | Raghavan et al. | |

* cited by examiner

*Primary Examiner* — Whitney T Moore
(74) *Attorney, Agent, or Firm* — Tuenlap D. Chan; Charles A. Brill; Frank D. Cimino

(57) ABSTRACT

An electronic device comprising a semiconductor structure having a back end capacitor and a back end thin film resistor and a method of manufacturing the same. The semiconductor structure includes a first dielectric layer, a bottom plate of the capacitor and a thin film resistor body. The bottom plate and the resistor body are laterally spaced apart portions of the same thin film layer. The bottom plate further includes a conductive layer overlying the thin film layer. A second dielectric layer is disposed on the conductive layer of the bottom plate of the capacitor. A top plate of the capacitor is disposed on the second dielectric layer.

9 Claims, 4 Drawing Sheets

INTEGRATED THINFILM RESISTOR AND MIM CAPACITOR WITH A LOW SERIAL RESISTANCE

CROSS-REFERENCE TO RELATED APPLICATIONS

This application is a divisional of U.S. Nonprovisional patent application Ser. No. 14/501,277 filed Sep. 30, 2014, which claims the benefit of U.S. provisional application Ser. No. 61/988,357, filed May 05, 2014, the contents of both of which are herein incorporated by reference in its entirety.

The following co-pending application is related and hereby incorporated by reference:

| Ser. No. | Filing Date | Inventor |
|---|---|---|
| 13/653,461 | Oct. 17, 2012 | DIRNECKER et al. |

FIELD OF THE INVENTION

The invention relates to an electronic device comprising a semiconductor structure having a back end thin film resistor and a back end capacitor with a low serial resistance. Furthermore, the invention relates to a method of manufacturing the electronic device.

BACKGROUND

Back end thin film capacitor structures according to the prior art "compete" with interconnect metallization routing in the metallization layers of a semiconductor device. Document US 2007/0170546 A1 discloses a back end thin film capacitor structure having a thin film capacitor comprising a top plate which is located in a metallization layer of a semiconductor device. However, this top plate of the capacitor takes valuable floor space in the metallization routing layer.

Thin film capacitors according to the prior art, for example a metal-insulator-metal capacitor (MIM capacitor), consume area in the interconnect level it is been built on. For example, an area which is occupied by a top plate or by a bottom plate of a thin film capacitor is not available for regular metallization routing in the metallization layer. Frequently, chip size increases or a level of interconnects increases due to the addition of a thin film capacitor in a semiconductor structure.

SUMMARY

It is an object of the invention to provide an electronic device comprising a semiconductor structure having a back end thin film resistor and a back end capacitor with low serial resistance. The capacitor and the resistor are easily integrated in existing semiconductor processes and chip area of the capacitor and the resistor do not compete with metallization routing in the semiconductor device.

An electronic device comprising a semiconductor structure having a back end capacitor and a back end thin film resistor and a method of manufacturing the same is provided. The semiconductor structure comprises a first dielectric layer, a bottom plate of the capacitor and a thin film resistor body. The bottom plate and the resistor body are laterally spaced apart portions of the same layer which are both disposed on the first dielectric layer and which are composed of a same thin film material. The bottom plate further includes a conductive layer overlying the thin film material. Furthermore, there is a second dielectric layer which is disposed on the conductive layer of the bottom plate of the capacitor. A top plate of the capacitor is disposed on the second dielectric layer in a region of the second dielectric layer which is defined by the lateral dimensions of the bottom plate of the capacitor.

The method of fabricating the electronic device includes sequentially depositing a thin film layer, a first conductive layer, a capacitor dielectric layer, and a second conductive layer. The second conductive layer and capacitor dielectric layer are removed in the resistor area. The first conductive layer is also removed in the resistor area. The thin film layer is etched to laterally separate the resistor body portion of the thin film layer from the capacitor bottom plate portion of the thin film layer. The capacitor bottom plate includes both a portion of the thin film layer and the first conductive layer.

BRIEF DESCRIPTION OF DRAWINGS

Further aspects and characteristics of the invention ensue from the following description of preferred embodiments of the invention with reference to the accompanying drawings, wherein FIGS. 1 to 8 schematically illustrate successive process steps involved in manufacturing a thin film back end capacitor and thin film back end resistor in an electronic device, according to embodiments of the invention.

DETAILED DESCRIPTION OF EXAMPLE EMBODIMENTS

FIGS. 1 to 6 illustrate an electronic device including a semiconductor structure having a thin film capacitor and thin film resistor according to the invention at various stages of fabrication. The back end thin film capacitor and the back end thin film resistor can be interconnected by a single level of interconnect metallization. Thin film layer thicknesses typically range between ~30 to ~3000 Å depending on layer purpose and application. Thin-Film resistor layers vary typically between 30 Å (e.g. 1000 ohm/sq SiCr) and 500 Å (e.g. 50 ohm/sq NiCr) depending on desired sheet resistance. Capacitor dielectric thin films typically are thinner than 500 Å depending on material and desired specific capacitance. Top and bottom plate metal electrode thicknesses can vary between several hundreds and a few thousand Å depending on specific resistance of the material, the desired serial resistance and/or process limitations.

The term "back end", frequently used within the context of this specification, describes the integration of components including the integration of thin film capacitors and thin film resistors on a partially fabricated integrated circuit structure. Previously, transistors and polycrystalline silicon structures have been formed in the integrated circuit. While a so called "front end" process typically includes process steps which are performed at process temperatures in a range of 600° C. to 700° C., a "back end" process typically includes process steps which are performed at lower temperatures which are roughly about 450° C.

A deposition in a region of another structure, in this case in the region which is defined by the lateral dimensions of the bottom plate of the capacitor, means that the lateral dimensions of the deposited structure are equal to or smaller than the lateral dimensions of the structure which is underneath. In other words, in a top view, an area of the top plate of the capacitor is equal to or smaller than the area of the bottom plate of the capacitor. Furthermore, a deposition of a first layer on top of a second layer may be read as a deposition directly on top of the respective layer.

Figure 1:
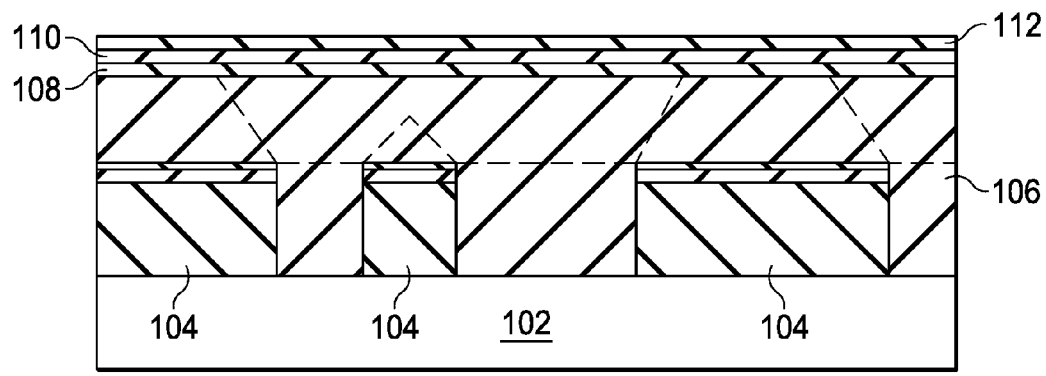

Referring to FIG. 1, a starting semiconductor substrate 102 (e.g., a silicon substrate) may comprise various active and passive devices (not shown) such as bipolar transistor and/or MOS transistors which have been formed already in various areas of the semiconductor substrate 102. A standard metallization and routing level 104 is provided on the semiconductor substrate 102, wherein the routing traces are covered by a first intermetal dielectric layer 106. After deposition, this first intermetal dielectric layer 106 may be planarized according to standard process steps in semiconductor fabrication.

Still referring to FIG. 1, a thin film layer 108 such as sicrome (SiCr), SiCr:C, NiCr, or NiCrAl, a first conductive layer 110, and a second dielectric layer 112 (for example a silicon nitride layer ($Si_3N_4$) or silicon dioxide layer ($SiO_2$)) and are deposited sequentially on top of the first intermetal dielectric layer 106. In particular, these layers may be directly adjacent to each other. When sicrome is used for thin film layer 108, it may have a typical sheet resistance ranging from 30Ω/ square to 2000Ω/square. The thin film layer 108 is deposited on the upper surface of the first intermetal dielectric layer 106. The first conductive layer 110 is deposited on the thin film layer 108. First conductive layer 110 has a lower sheet resistance than the thin film layer 108 and functions to reduce the serial resistance of the subsequently formed capacitor bottom plate. For example, first conductive layer 110 may comprise TiN at 10-20 ohms/sq. Other conductive materials, such as aluminum, may alternatively be used. The second dielectric layer 112 ($Si_3N_4$) is deposited on top of the first conductive layer 110. In one embodiment, the thin film layer 108 may have a thickness in the range of 400 Å and is formed directly on the first dielectric layer 106, the first conductive layer 106 may have a thickness in the range of 500 Å and is formed directly on the thin film layer 108, and the second dielectric layer 110 may have a thickness in the range of 250 Å and is formed directly on the first conductive layer 108.

Figure 2:
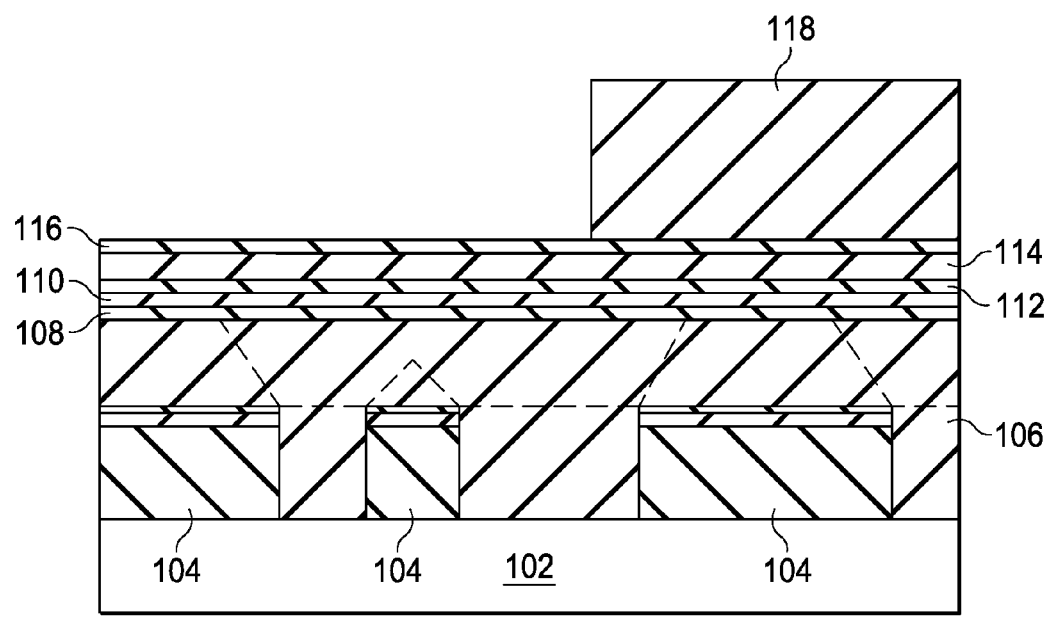

Referring to FIG. 2, a second conductive layer 114 for forming the top plate of the capacitor is deposited over the second dielectric layer 112 and a hard-mask layer 116 is deposited over the second conductive layer 114. Second conductive material 114 comprises a conductive material such as TiN or TiW. Hard-mask layer 116 may comprise an oxide, nitride, or oxynitride. A mask pattern 118 is deposited over second conductive material 114. Mask pattern 118 covers an area designated for the back end capacitor and exposes an area for the back end thin film resistor. Although the first and second conductive layers 114 may comprise metal, neither are part of a conventional metallization level. Rather, they are formed between metallization levels.

Figure 3:
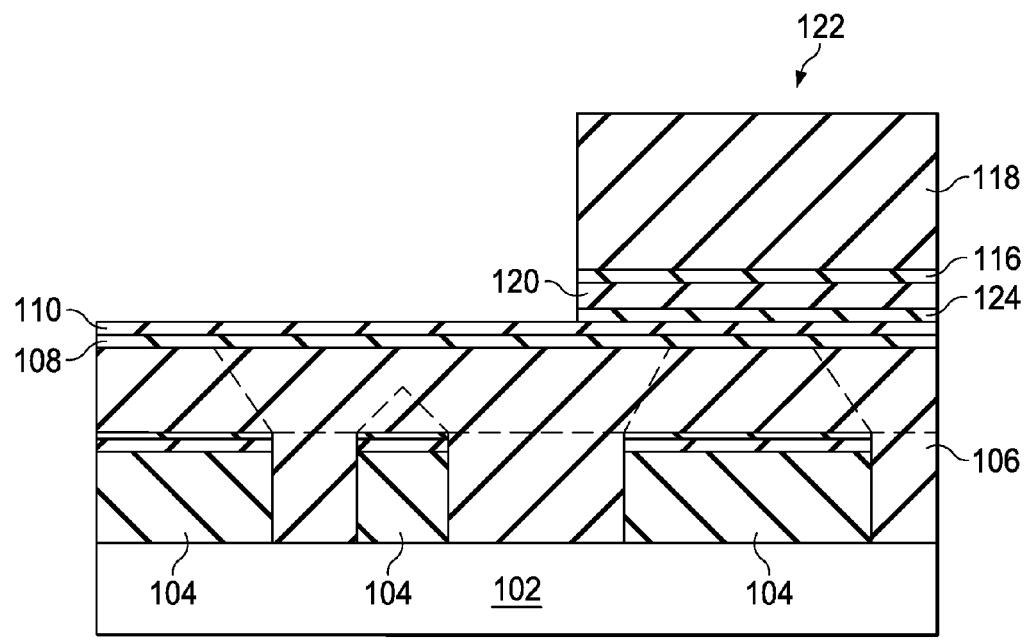

In FIG. 3, first patterning and etch back steps have been performed so as to provide a top plate 120 of the thin film capacitor 122 in the second conductive layer 114 and a capacitor dielectric 124 in the second dielectric layer 112. The first patterning and etching includes a hard-mask etch (e.g. a dry etch using an etch chemistry such as $C_xF_y/O_2$), a top plate etch (e.g., dry etch of TiN 114 stopping in the second dielectric layer 112 using an etch chemistry such as $BCl_3/Cl_2/N_2$) and a second dielectric layer 112 etch (e.g., a dry etch stopping in the TiN layer 110 using an etch chemistry such as $C_xF_y/O_2$). Accordingly, the hard-mask layer 116, second conductive layer 114, and second dielectric layer 112 are removed from the area designated for the thin film resistor. Advantageously, the second dielectric layer 112 provides an etch stop during the standard patterning and etch back steps which may be performed using conventional photoresist deposition, etching and cleaning steps, etc., according to conventional semiconductor technology.

Figure 4:
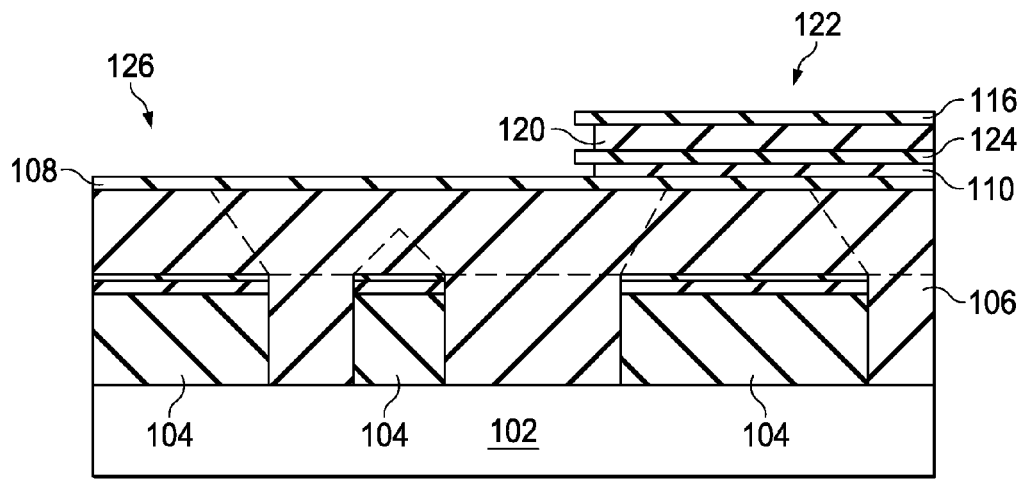

Referring to FIG. 4, the mask pattern 118 is removed. For example, an ashing process may be used to remove mask pattern 118. Then, using the remaining portion of hard mask layer 116 to protect the capacitor 122, a wet etch is performed to remove first conductive layer 110 from an area designated for the thin film resistor 126, leaving only the thin film layer 108 in the thin film resistor area. This wet etch may result in some undercutting of the top plate 120 and first conductive layer 110 in capacitor 122.

Figure 5:
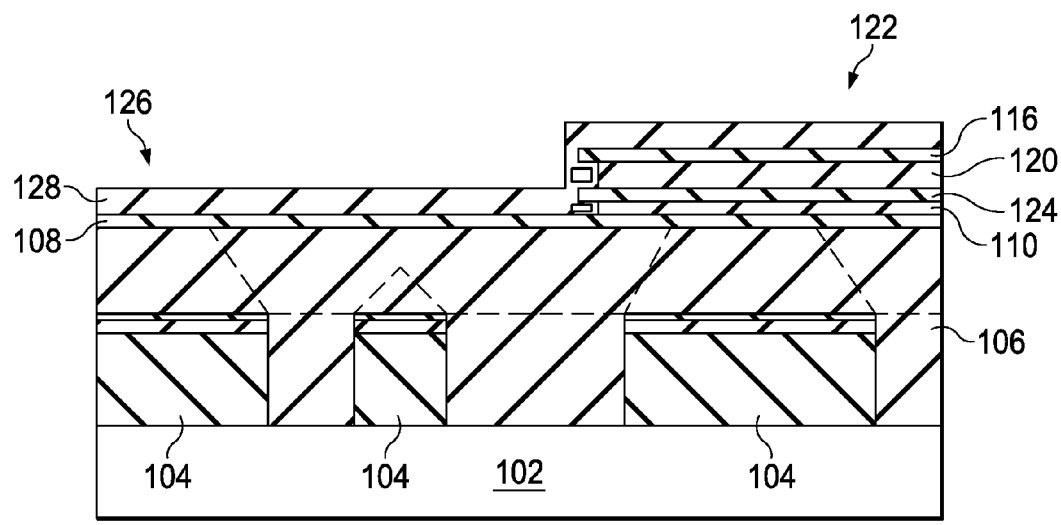

Referring to FIG. 5, a hard-mask layer 128 is deposited. Hard-mask 128 may also comprise an oxide, nitride or oxynitride.

Figure 6:
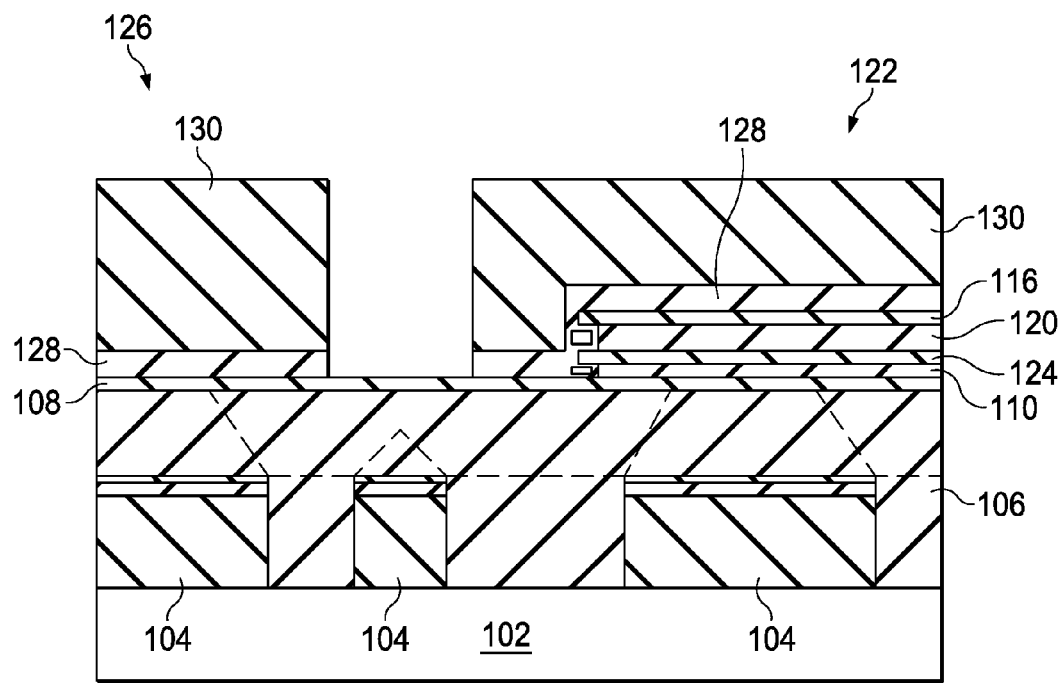

Referring to FIG. 6, a mask pattern 130 is formed. Mask pattern 130 covers capacitor 122 and thin film resistor 126 and exposes an area between capacitor 122 and thin film resistor 126. The exposed portion of hard-mask 128 is removed by etching, where the etch stops in the thin film layer 108. Mask pattern 130 is then removed (e.g., ashing). Standard post ash clean-up processes may also be performed.

The thin film layer 108 and conductive layer 110 are applied for manufacturing a bottom plate of a thin film capacitor and the thin film layer 108 alone is used to form a body of a thin film resistor. To provide a bottom plate of the thin film capacitor which is separate or laterally spaced apart from the body of the thin film resistor, the thin film layer 108 is etched using hard-mask 128 as a pattern as shown in FIG. 7.

Figure 7:
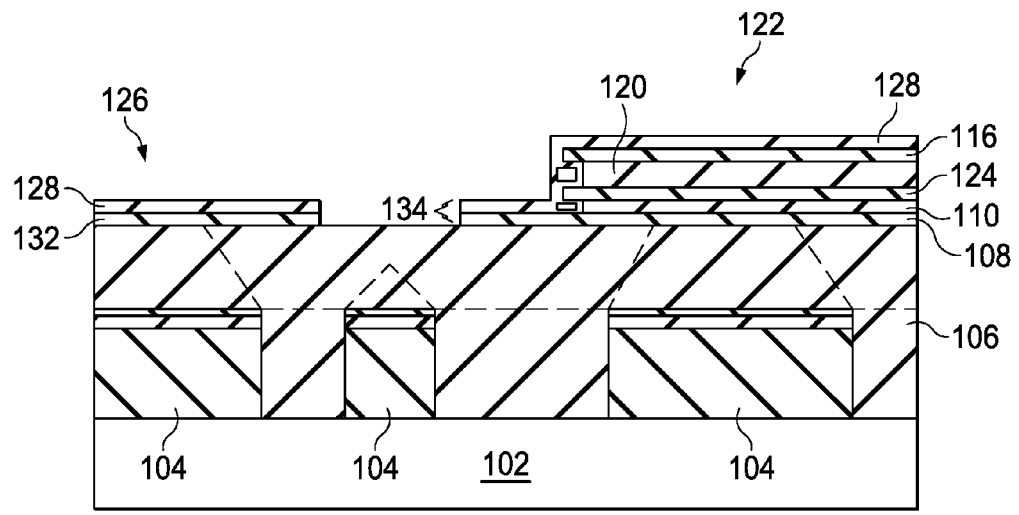

In FIG. 7, etching of the thin film layer 108 has been performed so as to provide a laterally separate thin film resistor body 132 of resistor 126 (a first portion of the thin film layer 108) and bottom plate 134 of the thin film back end capacitor 122 (a second portion of the same thin film layer 108). Bottom plate 134 includes both the thin film layer 108 and first conductive layer 110. Including first conductive layer 110 in bottom plate 134 provides an advantage of lower serial resistance.

Figure 8:
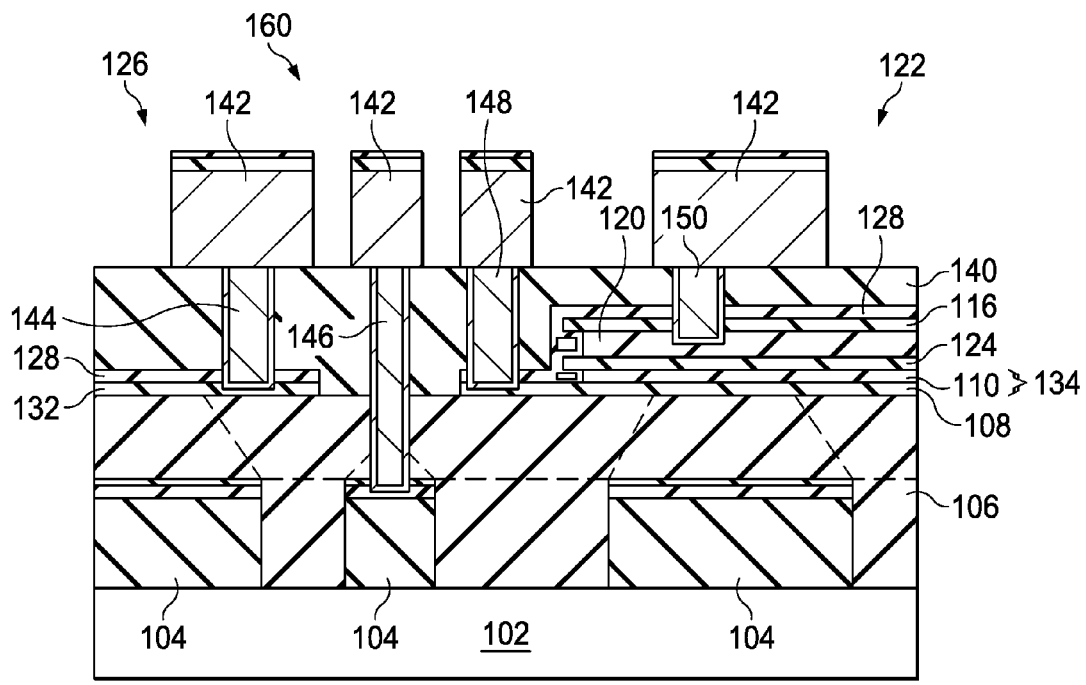

In FIG. 8, a second intermetal dielectric layer 140, which is the third dielectric layer, is deposited on top of the structure which is known from FIG. 7. This second intermetal dielectric layer 140 may undergo further process steps such as planarization. The second intermetal dielectric layer 140 provides a basis for further metallization levels which may be used for routing of traces in a semiconductor structure.

In FIG. 8, there is a further metallization level 142 which is deposited on top of the second intermetal dielectric layer 140. In addition, vertical conductive vias 144-150 are formed for electrically coupling the thin film resistor body 132 (via 144), metallization level 104 (via 146), the bottom plate 134 (via 148) and the top plate 120 (via 150) of the capacitor 122 to this second metallization level 142. Although thin film resistor 126 and capacitor 122 may include metal layers, they are not part of a conventional metallization levels. Rather, as shown in FIG. 8, they are formed between metallization levels 104 and 142. Metallization level 104 is level $M_N$ (e.g., $M_2$) and metallization level 142 is level $M_{N+1}$ (e.g., $M_3$).

The electronic device 160 of FIG. 8 may comprise further active and passive components which are not shown due to a simplification of the drawings only.

Although the invention has been described hereinabove with reference to specific embodiments, it is not limited to these embodiments and no doubt further alternatives will occur to the skilled person that lie within the scope of the invention as claimed.

The invention claimed is:

1. An electronic device comprising a semiconductor structure having:
   a first dielectric layer;
   a resistor body of a resistor including a first portion of a thin film layer on the first dielectric layer;
   a bottom plate of a capacitor including a second portion of the thin film layer and a conductive layer overlying the second portion of the thin film layer;
   a second dielectric layer disposed on the bottom plate of the capacitor;
   a top plate of the capacitor disposed on the second dielectric layer over the bottom plate; and
   a hard-mask layer directly on the first portion of the thin film layer and the top plate.

2. The electronic device of claim 1, wherein the thin film material of the bottom plate and the resistor body and the material of the top plate of the capacitor is metallic material.

3. The electronic device of claim 1, wherein the first dielectric layer is deposited on a first metallization level of the semiconductor structure.

4. The electronic device of claim 1, further comprising:
   a third dielectric layer which is disposed over the top plate of the capacitor and over the resistor body; and
   a second metallization level of the semiconductor structure is disposed on the third dielectric layer.

5. The electronic device of claim 4, further comprising a first conductive via, wherein the first conductive via extends through the third dielectric layer to the top plate of the capacitor.

6. The electronic device of claim 5, further comprising a second conductive via, wherein the second conductive via extends through the third dielectric layer to the bottom plate of the capacitor.

7. The electronic device of claim 6, further comprising a third conductive via, wherein the third conductive via extends through the third dielectric layer to the thin film resistor body.

8. The electronic device of claim 7, wherein the first conductive via, the second conductive via, and the third conductive via are all connected to the second metallization level.

9. The electronic device of claim 1, wherein the thin film layer for the bottom plate of the capacitor and for the thin film resistor body is composed of SiCr, the conductive layer is TiN, the second dielectric layer is composed of silicon nitride, and the top plate of the capacitor is composed of TiN.

* * * * *